United States Patent [19]

Agatsuma et al.

[11] 4,377,905
[45] Mar. 29, 1983

[54] METHOD FOR MANUFACTURING A NB₃SN SUPERCONDUCTOR AND METHOD FOR MANUFACTURING HOLLOW SUPERCONDUCTING MAGNET

[75] Inventors: Koh Agatsuma, Haijima; Kenichi Koyama, Tokorozawa; Itaru Todoriki, Tanashi; Osamu Kohno, Chiba; Takashi Saito, Yokohama, all of Japan

[73] Assignees: Agency of Industrial Science and Technology; Fujikura Cable Works, Ltd., both of Tokyo, Japan

[21] Appl. No.: 236,271

[22] Filed: Feb. 20, 1981

Related U.S. Application Data

[62] Division of Ser. No. 40,576, May 21, 1979, abandoned.

[30] Foreign Application Priority Data

Jun. 2, 1978 [JP] Japan .................................. 53/66420
Jun. 2, 1978 [JP] Japan .................................. 53/66421
Jun. 2, 1978 [JP] Japan .................................. 53/66423

[51] Int. Cl.³ ...................... H01B 13/00; H01B 12/00
[52] U.S. Cl. ......................................... 29/599; 29/605; 174/126 S; 174/128 S; 174/15 S; 335/216; 148/11.5 R
[58] Field of Search .............. 29/599, 605; 174/126 S, 174/128 S, 15 S; 335/216; 148/11.5 R, 11.5 F, 11.5 Q, 127, 133

[56] References Cited

U.S. PATENT DOCUMENTS

| | | | |
|---|---|---|---|
| 3,046,509 | 7/1962 | Wuczkowski | 29/605 |
| 3,728,165 | 4/1973 | Howlett | 148/11.5 Q |
| 3,731,374 | 5/1973 | Suenaga et al. | 148/127 |
| 3,836,404 | 9/1974 | Strauss | 148/11.5 R |
| 3,905,839 | 9/1975 | Hashimoto | 29/599 |
| 3,954,572 | 5/1976 | Ziegler et al. | 29/599 |
| 3,996,661 | 12/1976 | Ziegler et al. | 29/599 |
| 4,043,028 | 8/1977 | Koike et al. | 29/599 |
| 4,053,976 | 10/1977 | Scanlan et al. | 29/599 |
| 4,084,989 | 4/1978 | Meyer | 148/11.5 R |
| 4,161,062 | 7/1979 | Agatsuma et al. | 29/599 |
| 4,195,199 | 3/1980 | Hillmann et al. | 29/599 |
| 4,254,299 | 3/1981 | Horvath et al. | 174/15 S |

*Primary Examiner*—Daniel C. Crane
*Attorney, Agent, or Firm*—Darby & Darby

[57] ABSTRACT

A method for manufacturing a Nb₃Sn superconductor comprising the steps of preparing a composite conductor element which is composed of Cu-Sn alloy matrix and one or more Nb cores inserted and disposed in said matrix, if necessary sheathing the outer surface of the Cu-Sn alloy matrix with copper, subjecting the composite conductor element to a diameter reducing working until the predetermined diameter is reached, then forming an Sn-plating layer on the outer surface of the reduced diameter composite conductor element and thereafter subjecting the Sn-plated composite conductor element to diffusion heat treatment so that an intermetallic compound of Nb₃Sn is formed, and a method for manufacturing hollow superconducting magnet off an intermetallic compound type comprising the steps of extending a plurality of multicore superconductors together with thin tapes of a low temperature melting metal along grooves of a hollow conductor carrier, winding the superconductor assembly around a magnet reel and then heating up the superconducting magnet assembly to melt the thin tape of low temperature melting metal so that the multicore superconductors are secured to the hollow conductor carrier.

11 Claims, 10 Drawing Figures

METHOD FOR MANUFACTURING A NB3SN SUPERCONDUCTOR AND METHOD FOR MANUFACTURING HOLLOW SUPERCONDUCTING MAGNET

This is a division of application Ser. No. 040,576, filed May 21, 1979, now abandoned.

BACKGROUND OF THE INVENTION

The present invention relates to a method for manufacturing a $Nb_3Sn$ superconductor as well as a method for manufacturing a hollow superconducting magnet.

As well known, intermetallic compound type superconducting material, particularly $Nb_3Sn$ type superconducting material is expected to be available for a superconductor of superconducting magnet which is intended for nuclear fusion reactor or the like, because said superconducting material has remarkable superconductivity in comparison with other compound type or alloy type superconducting materials. Due to high brittleness and low workability, particularly low malleability and ductility of $Nb_3Sn$, however, it is difficult to work the $Nb_3Sn$ material in a form of rod or pipe to the predetermined reduced diameter by means of usual plastic working. In view of the aforesaid drawbacks with the $Nb_3Sn$ intermetallic compound a modified method for manufacturing $Nb_3Sn$ type superconductor was proposed, which comprises the steps of subjecting a composite conductor element in a form of rod or the like to a diameter reducing working until the required diameter is reached, said composite conductor element containing Nb and Sn still in a metallic state and then heating up the diameter reduced composite conductor element to the predetermined temperature so that Sn is diffused to form an intermetallic compound of $Nb_3Sn$.

It is recognized with the above known method that pure Nb may contact directly with pure Sn in the form of composite conductor element of Nb wire and Sn wire extending longitudinally side by side and the composite conductor element is subjected to diffusion heat treatment at an elevated temperature in the aforesaid arrangement. Alternatively, Cu may be employed as an Sn diffusion carrier so that the latter in diffused through the former at a lower temperature with much more formation of $Nb_3Sn$ than in case of the aforesaid direct diffusion. In practice, therefore, Cu is preferably employed as an Sn-diffusion carrier. As typical embodiments of employing Cu as an Sn-diffusion carrier the following methods were proposed: One of them is a so-called bronze method in which one or more pure Nb cores are inserted in Cu-Sn alloy matrix (bronze) in a form of rod, the Nb-inserted assembly is subjected to a diameter reducing working and then the diameter reduced assembly is heated up so as to form an intermetallic compound layer of $Nb_3Sn$ around the Nb cores. The other one is a so-called Sn-plating method in which one or more pure Nb cores are inserted in a pure copper rod, the Nb-inserted rod is subjected to a diameter reducing working, Sn-plating is formed on the outer surface of the diameter reduced rod and then the Sn-plated rod is heated up to form an intermetallic compound layer of $Nb_3Sn$ around the Nb cores. In fact, however, these conventional methods have advantages and disadvantages respectively and thus they are far from satisfactory.

Specifically the former bronze method has an advantage in that a sufficient amount of $Nb_3Sn$ is formed in a for relatively short period of time and moreover there is no requirement for controlling the thickness of the Sn-plating layer, but it has a disadvantage of less workability during the diameter reducing operation. Further the bronze method has another disadvantage in that usually a Cu-Sn alloy containing Sn 10 to 14 weight percent must be employed for practicing this method, therefore this Cu-Sn alloy has a tendency of work-hardening during the diameter reducing operation, which usually requires annealing to be effected when the reduction rate of sectional area reaches about 75 percent. In case each Nb core has to be reduced to several microns in diameter as is the case with multicore superconductors, annealing is repeatedly carried out, resulting in remarkably increased work hours and extremely reduced work efficiency. To eliminate the aforesaid disadvantage an improved bronze method was proposed, in which the Cu-Sn alloy matrix is sheathed with a Cu pipe having excellent workability and then the Cu-sheathed assembly is subjected to a diameter reducing working. It is pointed out as a problem with the improved method that Sn in the Cu-Sn alloy matrix is diffused into the outer Cu pipe during diffusion heat treatment, causing a shortage in Sn to take place, whereby a sufficient amount of $Nb_3Sn$ is formed only with much difficulty.

On the other hand, in the latter Sn-plating method, copper having good workability is sheathed over the Cu-Sn matrix for practicing this method, which causes annealing to be carried out in substantially less times than in case of the former method, but it is required to form Sn-plating having a thickness more than that required to form $Nb_3Sn$ on the outer surface of the Cu sheath after completion of the diameter reducing operation. Moreover it takes a long time to form such a thick Sn-plating and the required thickness is difficult to control. Further it is pointed out as another drawback with the Sn-plating method that since Sn is supplied from the Sn-plating layer apart from the Nb cores so as to form intermetallic compound of $Nb_3Sn$, the efficiency is lower than that of the former bronze method and moreover it takes long time to form a sufficient amount of $Nb_3Sn$.

As is well known, hollow superconductor having a longitudinal passage through which a cooling medium such as He or the like flows is preferably used for constructing a superconducting magnet. A typical known method for manufacturing the above type of superconductor is such that superconductor element is spirally wound around a hollow pipe made of metallic material having good conductivity such as copper or the like. This conventional method is suitably applied for manufacturing alloy-type superconductors having comparatively excellent workability, for instance, NbTi type superconductors. A drawback of the aforesaid conventional method is the difficulty of manufacturing intermetallic compound type superconductors, for instance, $Nb_3Sn$, $V_3Ga$, $Nb_3Ge$ type superconductors. Namely in case of an intermetallic compound type superconductor its, characteristics are worsened due to bending stress which is caused during the operation of winding an intermetallic compound superconductor element around the hollow copper pipe mainly because of high brittleness and reduced workability, particularly reduced malleability and ductility. In an extreme case the winding operation itself is difficult to be carried out. In view of the drawbacks with the known methods as mentioned above, the inventors invented a method for manufacturing an intermetallic compound type superconductor without a winding operation, as disclosed in Japanese Patent Application Nos. 131264/77 and 131265/77 corresponding to U.S. Pat. No. 4,151,062. This method is such that there is provided a hollow conductor carrier made of good conducting material such as copper in a rectangular cross-sectional shape, which has a longitudinal passage in the interior thereof, through which a cooling medium flows, and has grooves on the four sides thereof, while a plurality of conductor elements (in a metallic state where no intermetallic compound appears) with which the intermetallic compound type superconductor is constructed are braided and the braided conductor element assembly is worked to such a shape as to fit into said grooves, then the preformed conductor element assembly is subjected to diffusion heat treatment so that an intermetallic compound is formed and thereafter the diffused multicore conductor element is secured to said grooves with the aid of a low temperature melting metal such as soft solder. It has been recognized as an advantage with this method that since the conductor element assembly is worked to such a shape as to fit into the groove of the hollow conductor carrier prior to forming an intermetallic compound, no additional working is required after formation of the intermetallic compound, which means that there is no danger of worsening or deteriorating the characteristics of the obtained superconductor.

In manufacturing a superconducting magnet with the use of the hollow superconductor provided in accordance with the method as proposed above, usually the superconductor assembly is wound around a hollow magnet reel, after the respective superconductor is secured to the groove of the hollow conductor carrier. During the aforesaid winding operation compressive strain generates on the multicore superconductor located on the inner side toward the magnet reel, while tensile strain generates on the multicore superconductor located on the outer side apart from said magnet reel. When the winding diameter is very large relative to the diameter of the magnet reel or, conversely, when the superconductor has a small diameter relative to the winding diameter, said compressive and tensile strains are small respectively, whereby the multicore superconductor is scarcely injured and the characteristics thereof are little deteriorated. On the contrary, however, when the winding diameter is small or the diameter of the superconductor is very large, there is a danger that the multicore superconductor is injured or damaged and the characteristics thereof are worsened or deteriorated. In the worst case the outer multicore superconductor may be broken due to tensile strain, while the inner multicore superconductor may be buckled due to compressive strain.

SUMMARY OF THE INVENTION

It is an object of the present invention to provide a method for manufacturing a new $Nb_3Sn$ type superconductor, which is free from the drawbacks inherent to the conventional bronze method and Sn-plating method.

It is another object of the invention to provide a method for manufacturing a $Nb_3Sn$ superconductor, which is free from the drawbacks inherent to the conventional bronze method and Sn-plating method, wherein the Cu-Sn matrix contains less Sn than that of the conventional bronze method and has excellent workability, causing annealing to be carried out in substantially less time than in case of the bronze method, while the outer Sn-plating layer has only a thickness enough to compensate for shortage in Sn in the Cu-Sn alloy matrix.

It is another object of the invention to provide a method for manufacturing a $Nb_3Sn$ superconductor, which is free from the drawbacks inherent to the conventional bronze method and Sn-plating method, wherein the Cu-Sn alloy matrix is sheathed with a Cu pipe having excellent workability which enables annealing to be carried out in less times, while Sn in the Sn-plating layer is supplied to compensate for shortage in Sn due to diffusion of Sn into the Cu pipe so that a sufficient amount of $Nb_3Sn$ is formed, and moreover the thickness of the Sn-plating layer can be substantially reduced in comparison with the conventional Sn-plating method in which the Sn required to form $Nb_3Sn$ is supplied only from the Sn-plating layer.

It is another object of the invention to provide a method for manufacturing a multicore superconductor intended for a superconducting magnet, wherein a plurality of superconductor elements are braided together, the braided assembly is worked to the predetermined shape and then the preformed assembly is subjected to diffusion heat treatment so that the intermetallic compound type multicore superconducor becomes stable relative to the magnetic field, particularly when the intermetallic compound type superconductor is used for a superconducting magnet.

It is a further object of the invention to provide a method for manufacturing an intermetallic compound type superconducting magnet with which there is no danger that the multicore superconductor is damaged or deteriorated particularly in respect of its magnetic properties during the winding operation of the superconductor around the magnet reel.

Other objects, features and advantages of the present invention will be apparent from the following description.

To accomplish the aforesaid objects, there is provided in accordance with one aspect of the present invention a method for manufacturing a $Nb_3Sn$ superconductor, comprising the steps of preparing a composite conductor element which is composed of a Cu-Sn alloy matrix containing Sn less than 10 weight percent and one or more Nb cores inserted and disposed in said matrix, subjecting said composite conductor element to a diameter reducing working until the predetermined diameter is reached, then forming an Sn-plating layer on the outer surface of the reduced diameter composite conductor element and thereafter subjecting the Sn-plated composite conductor element to diffusion heat treatment so that an intermetallic compound of $Nb_3Sn$ is formed.

Further there is provided in accordance with another aspect of the invention a method for manufacturing an $Nb_3Sn$ superconductor, comprising the steps of inserting one or more Nb cores in a Cu-Sn alloy matrix, sheathing the outer surface of said Cu-Sn alloy matrix with copper, subjecting the Cu-sheathed assembly to a diameter reducing working until the predetermined diameter is reached, then forming an Sn-plating layer on the reduced diameter assembly and thereafter subjecting the Sn-plated assembly to diffusion heat treatment at an elevated temperature so that intermetallic compound of $Nb_3Sn$ is formed.

Furthermore there is provided in accordance with another aspect of the invention a method for manufacturing a hollow superconducting magnet in an intermetallic compound type, comprising the steps of a preparing a hollow conductor carrier made of high conducting material, in which there is formed a passage through which cooling medium flows and on which a there are formed one or more grooves, inserting preformed multicore superconductors in said grooves such that said multicore superconductors are extended along the bottom face of the grooves, while extending one or more thin tapes made of a low temperature melting metal along the upper and/or lower surface of said superconductor, winding the superconductor assembly around a magnet reel, heating up the magnet assembly after completion of winding operation so as to melt said thin tapes of low temperature melting metal and then cooling said magnet assembly so that the molten low temperature melting metal is solidified, causing the superconductors to be secured to the hollow conductor carrier.

BRIEF DESCRIPTION OF THE ACCOMPANYING DRAWINGS

Now the present invention will be described in more detail with reference to the accompanying drawings which illustrate preferred embodiments of the invention, in which.

DETAILED DESCRIPTION OF THE INVENTION

Now new methods for manufacturing an $Nb_3Sn$ superconductor will be described in the following.

Figure 1:
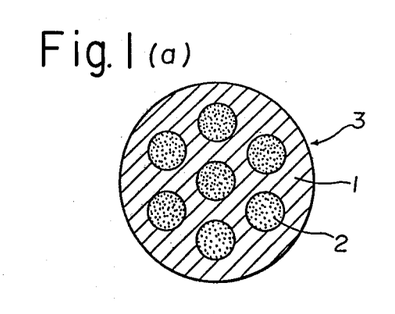
FIG. 1 is a stepwise illustration of the first embodiment of the method for manufacturing a $Nb_3Sn$ superconductor in accordance with the present invention.
Figure 2:
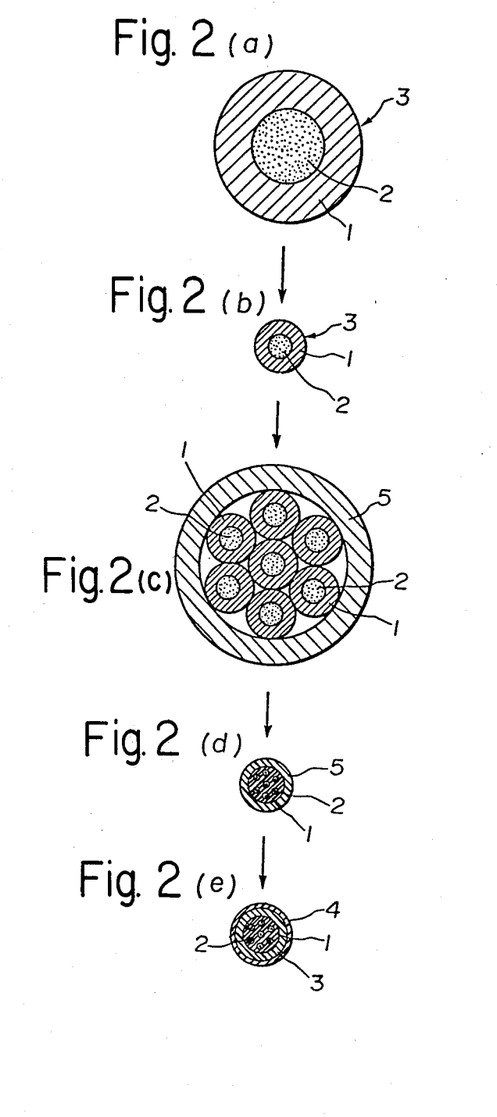
FIG. 2 is a stepwise illustration of a modification of the first embodiment of the invention in FIG. 1.

First of all, the first embodiment of the invention will be described with reference to FIGS. 1 and 2.

As shown in FIG. 1(a), there is provided a composite conductor element 3 which comprises a Cu-Sn alloy matrix 1 in the form of a drilled rod or tube and a plurality of pure Nb cores 2 in the form of a tube, wire or powder, said Cu-Sn alloy containing less than 10 weight percent Sn. It is to be noted that in case said Cu-Sn alloy contains more than 10 weight percent Sn in the same manner as the conventional bronze method, the number of times of annealing cannot be reduced due to a tendency of work hardening and decreased workability during the diameter reducing operation and thus the Cu-Sn alloy should preferably contain less than 10 weight percent Sn. In the meanwhile, the lower limit of the Sn component in said Cu-Sn alloy is preferably specified at least 2 weight percent because an extremely small amount of Sn contained in the Cu-Sn alloy fails to form a sufficient amount of $Nb_3Sn$ and the optimum amount of Sn component is specified 4 to 7 weight percent in view of improved workability and sufficient amount of $Nb_3Sn$ produced. Further a variety of methods for inserting and locating said Nb cores 2 in the Cu-Sn alloy matrix are proposed, for instance, a method comprising the steps of drilling one or more elongated holes through a Cu-Sn alloy rod and filling said holes with Nb powder, Nb wire or Nb rod and, a method of filling a hollow Cu-Sn tube with Nb powder or other type of Nb material.

Next the composite conductor element 3 prepared as mentioned above is repeatedly subjected to a diameter reducing working such as extrusion, swaging, drawing, stretching or the like, until the final diameter of required conductor element is reached as shown in FIG. 1(b). Then, as shown in FIG. 1(c), Sn-plating 4 having the predetermined thickness is formed on the reduced diameter composite conductor element 3 by means of electroplating or other methods. Then diffusion heat treatment for forming intermetallic compound of $Nb_3Sn$ is carried out at an elevated temperature under a non-oxidizing atmosphere such as a vacuum, an inert gas atmosphere or the like. Heat treatment temperature is preferably in the range of about 650° to 800° C., while the time of the diffusion heat treatment depends on the diameter of the composite conductor element to be heat treated and other factors and usually is in the range of 50 to 100 hours.

Owing to the above-described diffusion heat treatment at the elevated temperature, Sn in the Cu-Sn alloy matrix 1 as well as Sn in the Sn-plating 4 are diffused so that $Nb_3Sn$ is formed around the Nb cores 2. It is to be noted that the Sn concentration in the Cu-Sn alloy matrix 1 is lower than that in the known bronze method, but since Sn is additionally diffused from the outer Sn-plating 4 into the Cu-Sn alloy matrix 1 during diffusion heat treatment at the elevated temperature, resulting in additional supply of Sn into the matrix 1, a sufficient amount of $Nb_3Sn$ is formed at substantially the same efficiency as in the conventional bronze method. Further as, apparent from the foregoing description, the outer Sn-plating 4 is not a main Sn supply source for the purpose of forming the intermetallic compound of $Nb_3Sn$, but rather serves for compensating for shortage in Sn in the Cu-Sn alloy matrix 1. Hence the thickness of said Sn-plating 4 can be considerably smaller than that in the conventional Sn-plating method. This allows the Sn-plating operation to be easily controlled particularly in respect of the thickness of the Sn-plating without extending the time of this operation.

The composite conductor element 3 as described above may be individually subjected to a diameter reducing working until the required final diameter is reached. In case of manufacturing multicore superconductors, however, the diameter reducing working and assembling are usually repeated one after another. Specifically one example is illustrated in FIGS. 2(a) to (c), in which an Nb core 2 is inserted into a hollow tubular matrix of Cu-Sn alloy containing Sn less than 10 weight percent so as to form a composite conductor element 3 as illustrated in FIG. 2(a), then said composite conductor element 3 is subjected to diameter reducing working to such an extent as illustrated in FIG. 2(b), then several diameter reduced composite conductor elements are assembled in a pipe 5 of the same Cu-Sn alloy material as that of said matrix 1 and the conductor element assembly is subjected to a further diameter reducing working until the required diameter of the final conductor element is obtained and finally Sn-plating 4 is formed on the diameter reduced conductor element. It is to be noted that a small amount of P may be added into said Cu-Sn alloy and that usually assembling, inserting and diameter reducing working are usually repeated several times.

Thus the first embodiment of the method for manufacturing Nb$_3$Sn type superconductor in accordance with the present invention is provided with the following advantages: First, since Cu-Sn alloy containing less than 10 weight percent Sn is used for a matrix in which Nb core or cores are inserted and located, improved stretching workability is ensured and annealing after the individual diameter reducing working is carried out in remarkably shorter time than in a the conventional bronze method. Secondly, since Sn-plating after the diameter reducing working is applied only to such an extent as to compensate for shortage in Sn in the Cu-Sn alloy matrix containing less Sn concentration, the thickness of said Sn-plating can be reduced substantially below that of the conventional bronze method. Accordingly, the thickness of Sn-plating can be easily controlled during the plating operation without prolonging plating time. Thirdly, the intermetallic compound of Nb$_3$Sn is formed at almost the same efficiency as in the conventional bronze method where Cu-Sn alloy matrix containing a high Sn concentration is used.

Next, the second embodiment of the method for manufacturing an Nb$_3$Sn superconductor in accordance with the invention will be described with reference to FIGS. 3 and 4.

Figure 3A:
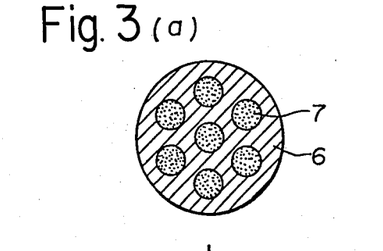
FIG. 3 is a stepwise illustration of the second embodiment of the method for manufacturing a $Nb_3Sn$ superconductor in accordance with the invention.
Figure 3B:
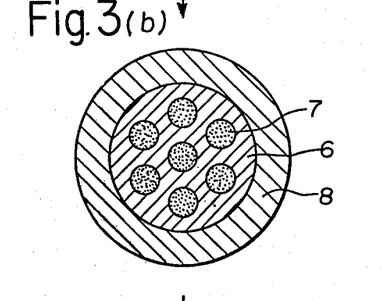
Figures 3C, 3D:
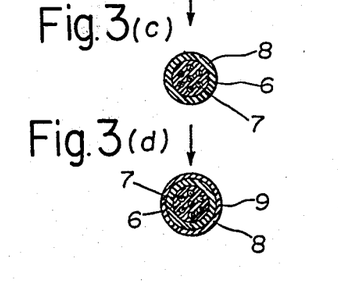

First, as shown in FIG. 3(a), there are provided a composite conductor element which comprises a Cu-Sn alloy matrix 6 in the form of a drilled rod, tube or the like and a plurality of pure Nb cores 7 in the form of a rod, wire, powder or the like arranged in place in said Cu-Sn alloy matrix, said Cu-Sn alloy containing Sn 2 to 15 weight percent, preferably 5 to 12 weight percent. It is to be noted that in case said Cu-Sn alloy matrix 6 is used in the form of a rod, one or more elongated holes are drilled therein so as to fill said holes with Nb cores 7, while in case the matrix 6 is in the form of a hollow tube, an Nb core 7 is inserted therein. Next, as illustrated in FIG. 3(b), a hollow pipe 8 of pure copper such as oxygen-free copper or the like is sheathed on said composite conductor element comprising the Cu-Sn alloy matrix 6 and the pure Nb cores 7 and then the Cu-sheathed conductor element assembly is subjected to a diameter reducing operation such as extrusion, swaging, drawing, stretching or the like, until the required diameter, that is, the required diameter of the final superconductor element is reached. Since the above-described conductor element assembly is such that the Cu-Sn alloy matrix 6 with less workability is sheathed with the Cu pipe 8 with higher workability, ductility (stretchability) of said conductor element assembly is excellent as a whole, so that annealing after the individual diameter reducing operation is carried out in remarkably less time than in case any Cu pipe is not sheathed.

After completion of the diameter reducing operation for the required final diameter, an Sn-plating 9 having the predetermined thickness is formed on the conductor element assembly by means of, for instance, electroplating or the like. Subsequent to the foregoing Sn-plating the conductor element assembly is subjected to a diffusion heat treatment at an elevated temperature under a non-oxidizing atmosphere such as vacuum, an inert gas atmosphere or the like so as a to form the intermetallic compound of Nb$_3$Sn. Heat treatment temperature is preferably in the range of 650° to 800° C., while time required for diffusion heat treatment is preferably in the range of 50 to 100 hours. As a result of the diffusion heat treatment at the elevated temperature Sn in the Cu-Sn alloy matrix 6 is diffused so that the intermetallic compound of Nb$_3$Sn is formed around the Nb cores 7. In the beginning period of the diffusion heat treatment a considerable amount of Sn in the matrix 6 is diffused into the outer Cu pipe 8 and moreover Sn in the outermost Sn-plating 9 is also diffused into the Cu pipe d, whereby the Sn concentration in the Cu pipe 8 is increased at a high speed. As the Sn concentration in the Cu pipe 8 reaches almost the same level as that in the matrix 6, Sn-diffusion into the Cu pipe 8 from the matrix 6 comes to a stop, and moreover when the Sn concentration in the Cu pipe 8 exceeds that in the matrix 6 due to excessive diffusion from the Sn-plating 9, reverse Sn-diffusion takes place from the Cu pipe 8 to the matrix 6 in the opposite direction so that the Sn concentration in the matrix 6 is increased. As a result it is recognized that the Sn concentration in the matrix 6 is hardly decreased, rather it is increased in some cases due to reverse diffusion from this outer Sn-plating 4. Due to the fact, the intermetallic compound of Nb$_3$Sn is formed at high efficiency. It is concluded from the foregoing description that the Cu-Sn alloy matrix 6 can contain 2 to 15 weight percent Sn.

Figures 4A, 4B, 4C, 4D, 4E:
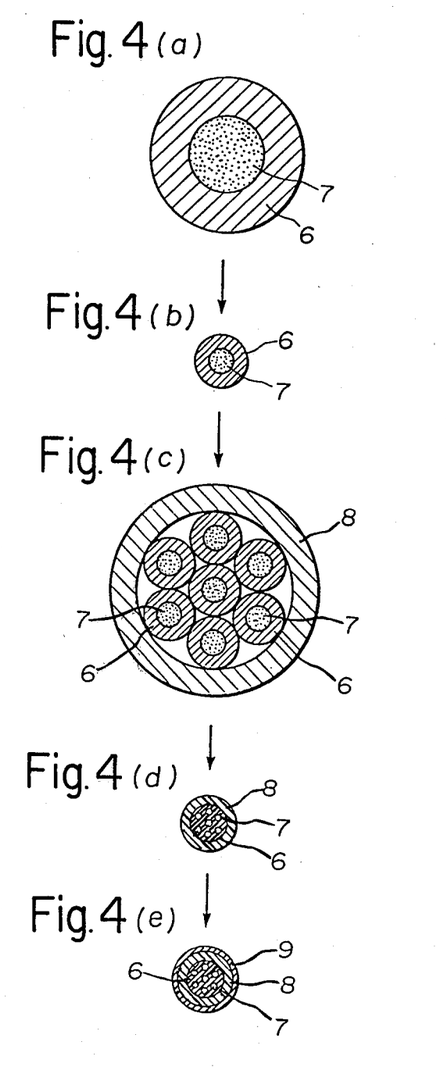
FIG. 4 is a stepwise illustration of a modification of the second embodiment of the invention in FIG. 3.

It is to be noted that the tubular Cu-Sn alloy matrix 6 in which the Nb cores 7 are embedded or inserted can be of course sheathed directly with the Cu pipe 8, as mentioned above, a multicore superconductor usually is manufactured in such a manner that the Cu-Sn alloy matrix 6 is subjected to a diameter reducing working to some extent prior to sheathing and several diameter reduced conductor elements are assembled to a bundle and then the conductor element assembly is inserted within the Cu pipe 8. Specifically one example is illustrated in FIGS. 4(a) to (e), in which an Nb core 7 is inserted into a hollow tubular matrix 6 of Cu-Sn alloy, as illustrated in FIG. 4(a), this sub-assembly comprising the matrix 6 and the core 7 is subjected to a diameter reducing working to some extent, as illustrated in FIG. 4(b), then several reduced diameter sub-assemblies are assembled to a bundle and inserted in the Cu pipe 8 of oxygen free copper or the like, as illustrated in FIG. 4(c), this assembly comprising the Cu pipe and several sub-assemblies are subjected to a final diameter reducing working until the required diameter is reached, as illustrated in FIG. 4(d) and finally Sn-plating 9 is formed on the diameter reduced assembly, as illustrated in FIG. 4(e). Assembling, inserting and diameter reducing working as mentioned above are usually repeated several times. When assembling, inserting and diameter reducing working are repeated many times, Cu pipe is used only in the final steps of assembling and inserting, and Cu-Sn alloy pipe having the same composition as that of the matrix may be used in intermediate steps of assembling and inserting.

The thickness of the Sn-plating provided prior to diffusion heat treatment can be determined in any suitable manner but it may be substantially smaller than that in the conventional Sn-plating, because, as apparent from the foregoing description, said Sn-plating 9 is not a main supply source of Sn required for formation of the intermetallic compound of $Nb_3Sn$ as is the case with the Sn-plating of the prior art, but rather serves to compensate for shortage in Sn content in the matrix 6 mainly due to diffusion into the Cu pipe. Hence thickness of Sn-plating can be easily controlled during the plating operation without prolonging plating time. It is to be noted that a small amount of P may be added into said Cu-Sn alloy. Alternatively, a sheath of Cu-Sn alloy pipe containing a small amount of Sn may be used in place of Cu pipe 8.

Thus the second embodiment of the method for manufacturing a $Nb_3Sn$ superconductor in accordance with the present invention is provided with the following advantages: First, since the Cu-Sn alloy matrix in which the Nb cores are inserted and located is sheathed on its outer surface with Cu tube which has good workability, annealing after individual diameter reducing operation is carried out in a remarkably shorter time than that in the conventional bronze method. Secondly, since the Sn-plating is formed on the outer surface of the Cu sheath after completion of the diameter reducing operation and then the assembly is subjected to diffusion heat treatment, there is no possibility that sufficient amount of intermetallic compound of $Nb_3Sn$ is not formed due to shortage in Sn, which is caused by diffusion of Sn from the Cu-Sn alloy matrix into Cu sheath. Thirdly, the thickness of Sn-plating can be reduced more substantially than in case of the conventional Sn-plating and moreover can be easily controlled without prolonging plating time. Fourthly, Sn-diffusion takes place at a lower temperature in case of Cu-sheathing.

Besides the aforesaid methods of the invention there is another method in which the matrix 6 is constructed of high Sn concentration Cu-Sn alloy containing Sn more than 10 weight percent in a form of rod, tube or the like, while the pipe sheath 8 is constructed of low Sn concentration Cu-Sn alloy containing a smaller amount of Sn than that of said high Sn concentration Cu-Sn alloy, for instance, said low Sn concentration Cu-Sn alloy is an alloy containing less than 10 weight percent Sn. In this modified embodiment of the invention the Cu-Sn alloy matrix 6 has less workability due to high Sn concentration (more than 10 weight percent) but the outer Cu-Sn alloy pipe sheath 8 has good workability (stretchability) because of less Sn concentration than that in said Cu-Sn alloy matrix. Therefore annealing after an individual diameter reducing working is carried out in less time than that in case of a diameter reducing working with the high Sn concentration Cu-Sn alloy matrix 6 alone. In order to improve further stretchability and to reduce the number of times of annealing, Sn concentration in the low Sn concentration Cu-Sn alloy pipe is preferably in the range of 2 to 8 weight percent, while Sn concentration in the high Sn concentration Cu-Sn alloy is more than 10 weight percent but less than 15 weight percent, preferably in the range of 10 l to 12 weight percent. It is to be noted that it is possible that a sheath of pure Cu such as oxygen free copper or the like may be arranged on the low Sn concentration Cu-Sn alloy pipe.

Next, a method for manufacturing a hollow superconducting magnet in accordance with the invention will be described with reference to FIGS. 5 to 8. The hollow superconducting magnet of the invention is such that prior to forming an intermetallic compound in accordance with various kinds of braiding or preforming operation is carried out in such a manner that braided or preformed conductors are fit into grooves of a hollow conductor carrier, then the conductor assembly is subjected to a diffusion heat treatment and then the multicore superconductor is wound around a magnet reel in the presence of a low temperature melting metal which is molten by heating up after completion of the winding operation and thereafter is solidified so that tight securing is ensured.

Figure 5:
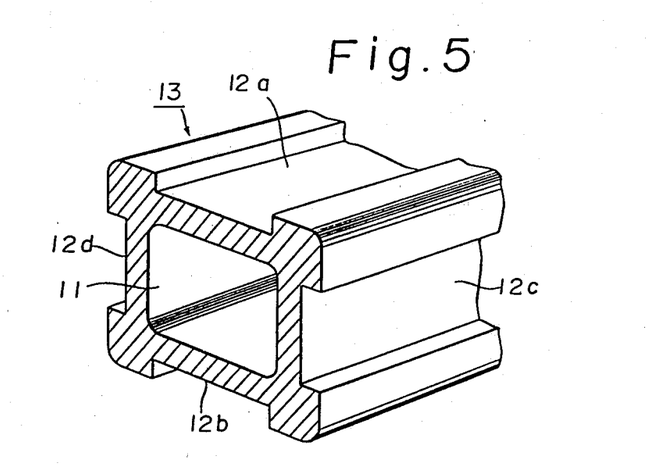
FIG. 5 is a perspective view of an example of a hollow superconductor carrier which is intended to be used for manufacturing a hollow superconducting magnet, shown as cross-sectioned in an enlarged scale.

As shown in FIG. 5, the hollow conductor carrier 13 in use for the superconducting magnet of the invention is constructed of an excellent conductive material which is usually copper, preferably oxygen-free copper, having a rectangular cross section, the central portion of which is formed with a passage 11 through which a cooling medium such as helium flows. Further the hollow conductor carrier 13 is provided with grooves $12a$ to $12d$ on the four outer surface thereof respectively.

Figure 6:
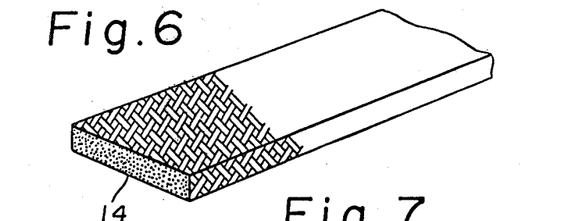
FIG. 6 is a perspective view of an example of a preformed multicore superconductor in accordance with the invention.

A multicore superconductor 14 to be extended along said grooves $12a$ to $12d$ is constructed of an intermetallic compound type superconducting material such as $Nb_3Sn$, $V_3Ga$, $Nb_3Ge$ and the like, which is preformed in such a configuration as to be fit into said grooves as shown in FIG. 6.

The $Nb_3Sn$ superconductor manufactured in accordance with the first and second embodiments of the invention may be used for said multicore superconductor 14.

Figure 10:
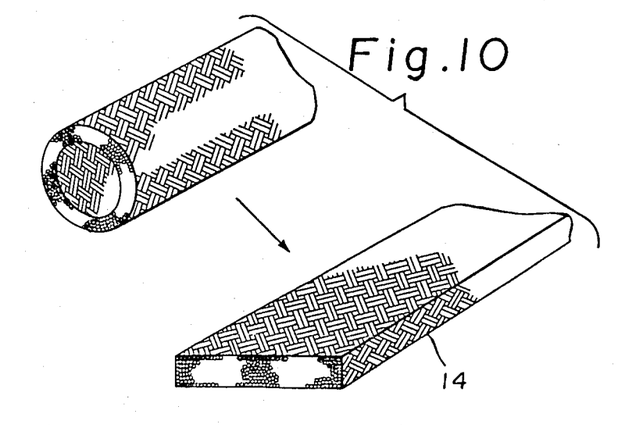
FIG. 10 is a perspective view of intermetallic compound type multicore superconductors which are braided and worked to the predetermined shape of FIG. 6.

Further another multicore superconductor may be available for the same purpose, which is manufactured in accordance with the following two typical methods: One of them is such that first a hollow pipe is provided which is made of Cu alloy which comprises Cu (preferably oxygen free copper) and one of at least two elements with which an intermetallic compound such as $Nb_3Sn$, $V_3Ga$, $Nb_3Ge$, $Nb_3Ga$, $Nb_3Si$, $Nb_3Al$, $Nb_3(Al_{0.8}Ge_{0.2})$ or the like is formed, then said hollow tube is filled with the other one of said at least two elements in a form of rod, wire or powder, then the filled tube is subjected to a diameter reducing working such as swaging, stretching, drawing or the like so that the required diameter is reached, then several of said reduced diameter tubes are assembled into a bundle and inserted in a hollow pipe similar to the aforesaid one, then the assembly is subjected to repeated diameter reducing workings until the required diameter is reached, then a plurality of said composite conductor elements are subjected to a braiding operation, then as shown in FIG. 10 the braided conductor element assembly is worked to a flat plate with the aid of a roll or the like so as to be exactly placed in said grooves $12a$ to $12d$, and finally the flattened conductor element assembly is subjected to a diffusion heat treatment in single or several steps under vacuum or an inert gas atmosphere at a temperature range within which a superconducting intermetallic compound is formed from each of the aforesaid elements. The other one is such that first a hollow pipe of Cu (preferably oxygen free copper) is provided, then the hollow tube is filled with one of the aforesaid elements in a form of a rod, wire or powder, then the filled pipe is subjected to a diameter reducing working, then several diameter reduced conductor elements are assembled to a bundle and subjected to a repeated diameter reducing working in the same manner as mentioned above, then the reduced diameter assembly is formed on its outer surface with a plating of the other one of the aforesaid elements which is prepared by dip plating or the like, then the composite conductor element is subjected to a braiding operation in the same manner as in the preceding method, then the braided assembly is worked to such a shape as to be adapted to the grooves 12a to 12d and finally the preformed conductor element assembly is subjected to a diffusion heat treatment. Owing to the above-described fact that the multicore superconductor elements containing an intermetallic compound therein are braided and then worked to the predetermined configuration, it becomes possible to make a winding around a magnet reel. The braided multicore superconductor elements afford a superconducting magnet which has a high critical temperature, critical field and critical current density with stable magnetic characteristics in the direction of the magnetic field.

Alternatively it is proposed as a modified method of the invention that a plurality of composite conductor elements are inserted in a Cu pipe (preferably oxygen free copper), then the assembly subjected to diameter reducing working and subsequent working to the predetermined configuration so as to fit into the aforesaid groove and finally the diameter reduced and preformed assembly is subjected to a diffusion heat treatment so that a multicore superconductor comprising a number of composite conductor elements is manufactured without any braiding operation.

Figure 7:
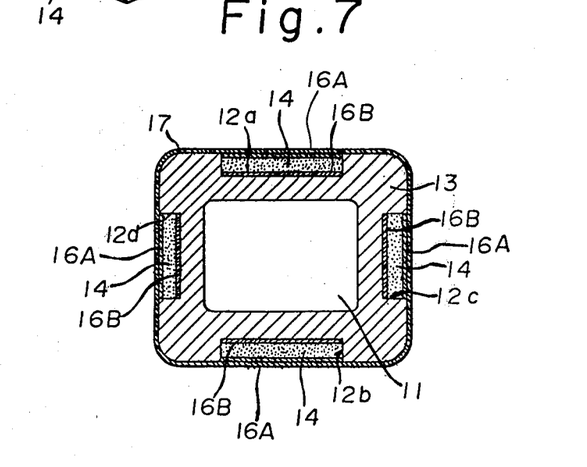
FIG. 7 is a cross sectional view of the hollow conductor carrier with the multicore superconductors extending along the grooves thereof.

Prior to winding the multicore superconductor manufactured in the above-described manner around a magnet reel 15, a flattened multicore superconductor 14 is extended along the grooves 12a to 12d of a hollow conductor carrier, while thin tapes 16A and 16B made of a low temperature melting metal such as a Sn-Ag alloy containing Ag 5 percent, Sn, Sn-Pb alloy, In or In alloy are extended along the upper face and lower face of the flattened multicore superconductor 14 respectively, and heat resistant insulating tape 17 made of, for instance, polyimide (Kapton, trade name), polyamidimide, polyester, polytetrafluoroethylene or the like is spirally wound around the assembly comprising the thin tapes, multicore superconductors and hollow conductor carrier provided in the above-described manner, as illustrated in FIG. 7. Next the whole conductor assembly is wound around a magnet reel 5 which is designed and constructed for the required superconducting magnet.

Figure 8:
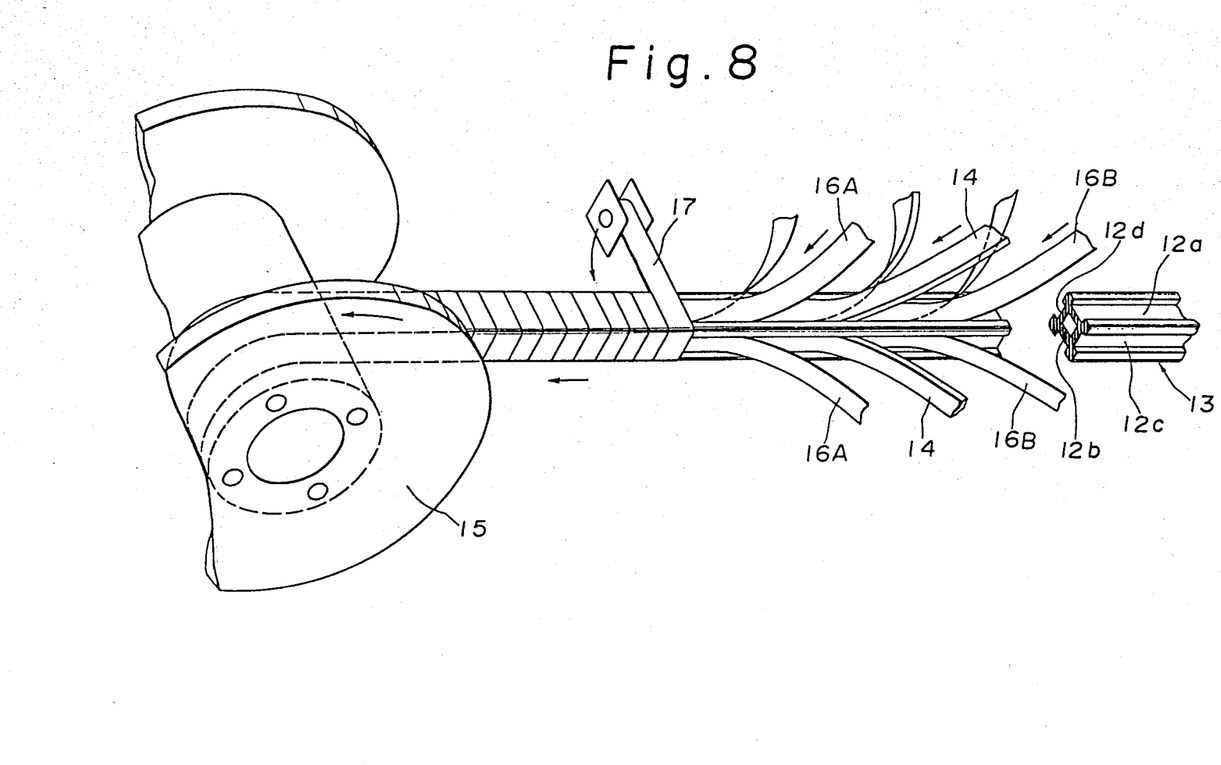
FIG. 8 is a perspective view illustrating an embodiment of a method for manufacturing a hollow superconducting magnet in accordance with the invention.

In order that the above-described steps are successively performed, a typical arrangement is proposed, as illustrated in FIG. 8, in which the low temperature melting metal thin tape 16B, the multicore superconductor 14 and another low temperature melting metal thin tape 16A are extended one above another along the grooves 12a to 12d of the hollow conductor carrier 13 respectively, while said hollow conductor carrier 13 is travelling toward the magnet reel 15 and the insulating tape 17 is being spirally wound around the previously assembled conductor carrier 13, and finally the assembled and tape-wrapped conductor assembly is continuously wound around the magnet reel which is rotating at the predetermined speed.

After completion of winding around the reel 15, the whole assembly is placed and heated above the melting temperature of said thin tapes in a non-oxidizing atmosphere such as vacuum, nitrogen gas atmosphere, argon gas atmosphere or the like. Thus the low temperature melting metal of the thin tapes 16A and 16B is molten and then deeply penetrated into the clearance between the respective braided conductor elements of the multicore superconductor as well as into the space between the latter and the grooves of the hollow conductor carrier. Thereafter as the molten low temperature melting metal is cooled and solidified, the multicore superconductors are tightly secured within the respective grooves of the hollow conductor carrier. As a result a hollow superconducting magnet is obtained, which comprises a plurality of multicore superconductors wound around the magnet reel.

It is to be noted that the thin tapes of low temperature melting metal are not always required to be located along both the upper and lower faces of the multicore superconductor but they may be extended along either of said faces. Namely the thin tapes may be arranged, for instance, only on the outer face of the multicore superconductor. Preferably the thin tape has a width a little smaller than that of the multicore superconductor. Moreover preferably the multicore superconductor is previously coated with a low temperature melting metal similar to that of the aforesaid thin tape by means of immersion in a melting bath, whereby molten metal of the thin tapes is united with another molten metal of the coated multicore superconductors, resulting in quick penetration into the clearance between the respective braided conductor elements of the multicore superconductor as well as between the multicore superconductor and the groove of the hollow conductor carrier as well as in compensation for shortage in molten metal, which may occur in case low temperature melting metal is available only from the thin tapes. In some case low temperature melting metal may be previously plated over the outer surface of the hollow conductor carrier (inclusive the inside of the groove). As described above, melting is carried out in a non-oxidizing atmosphere, but it is most preferable that the whole assembly is located under vacuum so as to ensure uniform penetration of molten metal between the multicore superconductors and the grooves of the hollow conductor carrier.

Since the method for manufacturing the hollow superconducting magnet in accordance with the invention comprises the step that the multicore superconductors are secured to the hollow conductor carrier after completion of winding of the multicore superconductor assembly around the magnet reel, as seen from the foregoing description, the method of the invention has a remarkable advantage in that no tension and compression strains are exerted on the multicore superconductors, which tend to be caused by bending the hollow conductor carrier during winding operation and thereby there is no possibility with the multicore superconductors are damaged or deteriorated in the course of the winding operation. Hence superconducting magnets having excellent magnetic characteristics is steadily provided. Further, when the superconducting magnet is constructed of multicore superconductors which are braided and preformed to the predetermined sectional configuration, this magnet is suitably employed for pulsating application in any direction of magnetic field, for instance, as a pulse magnet intended for nuclear fusion and energy storage.

The following examples are given as specific illustrations of the present invention. It should be understood, however, that the present invention is not limited to the specific details set forth in the examples.

EXAMPLE 1

Manufacturing a Multicore Superconductor

First Nb wires having an outer diameter of 7.5 mm are inserted in a hollow pipe made of Cu-Sn alloy containing 6 weight percent Sn as well as having an outer diameter of 10 mm and an inner diameter of 8 mm, then the sub-assembly of Cu-Sn alloy hollow pipe and Nb wires is subjected to diameter reducing working until the outer diameter is reduced to 1.5 mm, then 19 diameter reduced sub-assemblies are assembled to a bundle and inserted in a hollow pipe similar to said hollow pipe, then the second sub-assembly is subjected to further diameter reducing working until the outer diameter is reduced to 0.9 mm, then 61 diameter reduced second sub-assemblies are assembled to a bundle and inserted in a hollow pipe similar to said first and second ones and finally the third assembly is subjected to further another diameter reducing working until the outer diameter is reduced to 0.1 mm. At this time when the final diameter reducing working is completed, the total number of Nb cores amounts to 1,159. Next, Sn is plated on the outer surface of the diameter reduced assembly to form Sn-plating having a thickness of 1.5 μm and thereafter it is subjected to diffusion heat treatment in nitrogen gas atmosphere at a temperature of 725° C. for 100 hours so that intermetallic compound of $Nb_3Sn$ is formed. On measuring superconductivity of the obtained $Nb_3Sn$ multicore superconductor it is found out that it has critical current of 14 A in magnetic field of 30 KG at a temperature of 4.2 K., while it has critical current density of $1.8 \times 10^5$ A/cm$^2$. In the meantime each $Nb_3Sn$ core has critical current density of $1.3 \times 10^6$ A/cm$^2$.

EXAMPLE 2

Manufacturing a Multicore Superconductor

First Nb wire having an outer diameter of 5.5 mm is inserted in a hollow pipe made of Cu-Sn alloy containing Sn 5 weight percent and P 0.15 weight percent as well as having an outer diameter of 10 mm and an inner diameter of 6 mm, then the sub-assembly of Cu-Sn alloy hollow pipe and Nb wires is subjected to diameter reducing working until the outer diameter is reduced to 1.1 mm, then 19 diameter reduced sub-assemblies are assembled to a bundle and inserted in a hollow pipe similar to said hollow pipe and finally the sub-assembly is subjected to further diameter reducing working until the outer diameter is reduced to 0.3 mm. At this time when the final diameter reducing working is completed, the total number of Nb cores amounts to 361. Next, Sn is plated on the outer surface of the diameter reduced assembly to form Sn-plating having a thickness of 5 μm and thereafter it is subjected to diffusion heat treatment in argon gas atmosphere at a temperature of 740° C. for 100 hours so that intermetallic compound of $Nb_3Sn$ is formed. On measuring superconductivity of the obtained multicore superconductor, it is found out that it has critical current density of $2 \times 10^5$ A/cm$^2$ in magnetic field of 30 KG at a temperature of 4.2 K.

EXAMPLE 3

Manufacturing a Multicore Superconductor

First Nb wire having an outer diameter of 5.5 mm is inserted in a hollow pipe made of Cu-Sn alloy containing Sn 10 weight percent as well as having an outer diameter of 10 mm and an inner diameter of 6 mm, then the sub-assembly of Cu-Sn alloy hollow pipe and Nb cores is subjected to diameter reducing working until the outer diameter is reduced to 0.9 mm, then 19 diameter reduced sub-assemblies are assembled to a bundle and inserted in a hollow pipe made of Cu-Sn alloy containing Sn 10 weight percent as well as having an outer diameter of 10 mm and an inner diameter of 9 mm, then the second sub-assembly is subjected to further diameter reducing working until the outer diameter is reduced to 0.9 mm, then 61 diameter reduced second sub-assemblies are assembled to a bundle and inserted in a hollow pipe made of oxygen free copper as well as having an outer diameter of 12 mm and an inner diameter of 9 mm, and finally the third assembly is subjected to further another diameter reducing working until the outer diameter is reduced to 0.1 mm. At this time when the final diameter reducing working is completed, the total number of Nb cores amounts to 1,159, whereas the Cu-Sn alloy portion in the diameter reduced element occupies approximately 80 percent of the total cross sectional area thereof. Next, Sn is plated on the outer surface of the diameter reduced assembly by means of electroplating to form Sn-plating having a thickness of 1.5 μm and thereafter it is subjected to diffusion heat treatment in nitrogen gas atmosphere at a temperature of 740° C. for 100 hours so that intermetallic compound is formed and thus a superconductor is obtained. On measuring superconductivity of the obtained multicore superconductor, it is found out that it has critical current of 14 A in magnetic field of 30 KG at a temperature of 4.2 K., while it has critical current density of $1.8 \times 10^5$ A/cm$^2$. Judging from the above-mentioned results, it is obvious that the superconductor manufactured in the manner as mentioned in this Example has excellent superconductivity.

EXAMPLE 4

Manufacturing a Multicore Superconductor

First Nb wire having an outer diameter of 5.5 mm is inserted in a hollow pipe made of Cu-Sn alloy containing Sn 12 weight percent as well as having an outer diameter of 10 mm and an inner diameter of 6 mm, then the sub-assembly is subjected to diameter reducing working until the outer diameter thereof is reduced to 0.9 mm, then 19 diameter reduced sub-assemblies are assembled to a bundle and inserted in a hollow pipe made of Cu-Sn alloy containing Sn 12 weight percent as well as having an outer diameter of 10 mm and an inner diameter of 9 mm, then the second sub-assembly is subjected to further diameter reducing working until the outer diameter of the respective Nb core is reduced to 0.1 mm, then 61 diameter reduced second sub-assemblies are assembled to a bundle and inserted in a Cu-Sn alloy pipe containing Sn 3 weight percent as well as having an outer diameter of 12 mm and an inner diameter of 9 mm, and finally the third assembly is subjected to further another diameter reducing working until the outer diameter is reduced to 0.1 mm. At this time when the final diameter reducing working is completed, the total number of Nb cores amounts to 1,159, whereas the latter Cu-Sn alloy portion in the diameter reduced conductor element occupies approximately 40 percent of the total cross sectional area thereof. Next, Sn is plated on the outer surface of the diameter reduced assembly by means of electroplating to form a Sn-plating having a thickness of 1.0 μm and thereafter it is subjected to diffusion heat treatment in argon gas atmosphere at a temperature of 740° C. for 100 hours so that intermetallic compound of Nb$_3$Sn is formed and thus a required Nb$_3$Sn superconductor is obtained. On measuring superconductivity of the obtained multicore superconductor, it is found out that it has critical current of 14 A in magnetic field of 30 KG at a temperature of 4.2 K., while it has critical current density of $1.8 \times 10^5$ A/cm$^2$. Judging from these results, it is obvious that the superconductor manufactured in the manner as described in this Example has excellent superconductivity.

EXAMPLE 5

Manufacturing a Hollow Superconducting Magnet

Figure 9:
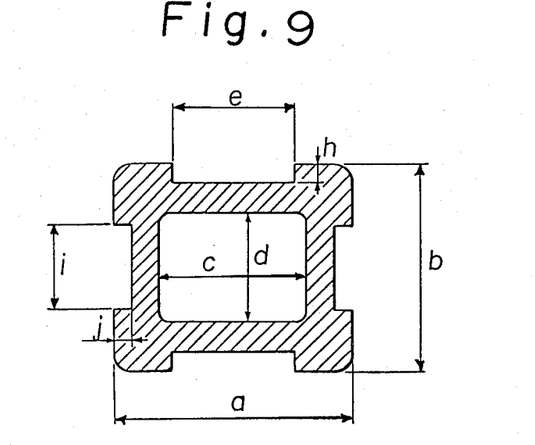
FIG. 9 is a cross sectional view illustrating a dimensional configuration of the hollow conductor carrier used in Example 5.

A hollow conductor carrier as illustrated in FIG. 9, which is made of oxygen free copper is prepared. The cross-sectional dimensions a to j of said hollow conductor carrier are as follows (see FIG. 9):
outer dimensions—$a \times b = 6.0 \times 5.0$ mm
inner dimensions—$c \times d = 3.4 \times 2.4$ mm
dimensions of wide groove—$e \times h = 2.8 \times 0.8$ mm
dimensions of narrow groove—$i \times j = 1.8 \times 0.8$ mm Further the cross-sectional dimensions of braided multicore superconductor to be extended along said grooves of the hollow conductor carrier are as follows:
2.3 (width) $\times$ 0.4 (thickness) mm for wide groove
1.3 (width) $\times$ 0.4 (thickness) mm for narrow groove This multicore superconductor is such that a plurality of composite conductor elements manufactured as described in the preceding Example 3 are braided and then worked to the flat shape having the above dimensions and thereafter the braided and preformed conductor is subjected to diffusion heat treatment so that intermetallic compound of Nb$_3$Sn is formed. This multicore superconductor is dipped in a plating bath of Sn-5%Ag alloy to coat it on the outer surface thereof. Then two thin tapes made of Sn-5%Ag alloy as well as having a thickness of 0.2 mm and a width a little narrower than that of the multicore superconductor are arranged on and extended along the upper and lower wide surfaces of the multicore superconductor in a sandwich-like structure, while being inserted and located within the grooves of said hollow conductor carrier. Subsequent to the preceding steps the conductor assembly is spirally wound by insulating tape of polyimide (a trade name of Kapton) and then the tape wound conductor assembly is wound around a magnet reel. After completion of winding operation the whole magnet assembly is placed in a vacuum furnace and as pressure in said furnace reaches $10^{-1}$ to $10^{-3}$ Torr, said magnet assembly is heated up to a temperature of 270° C., maintained at this temperature for 2 hours and then cooled. When the furnace is cooled down to the room temperature, vacuum in the furnace is released to restore the atmosphere pressure so that the heat treated magnet assembly is taken away from the furnace. On examining four superconducting magnets which are piled up in the form of double pancake coil one above another particularly in respect of current strength characteristics at an extremely low temperature of 4.2 K., the result is that current strength of 2,200 A is obtained in the maximum magnetic field of 28 KG. Hence obviously it can be concluded that the superconducting magnet manufactured in accordance with the method of the invention has excellent magnetic characteristics.

What is claimed is:

1. A method of manufacturing a hollow superconducting magnet of an intermetallic compound type, comprising the steps of:
   (a) preparing an elongated hollow conductor carrier made of an excellent conducting material, said carrier having (i) a passage formed therethrough for flowing a cooling medium and (ii) a groove having a bottom wall and an opening formed on an outer surface thereof and extending in a longitudinal direction;
   (b) inserting a multicore superconductor in said groove, said superconductor extending along said groove with said superconductor having an upper surface and a lower surface with the lower surface being adjacent said bottom wall of said groove and the upper surface extending within the opening of said groove;
   (c) extending a tape of low temperature melting metal along at least one of the upper surface and lower surface of said superconductor;
   (d) wrapping an insulating tape about the carrier thereby forming a superconductor assembly;
   (e) winding said superconductor assembly around a magnet reel to form a magnet assembly;
   (f) subsequent to step (e) heating said magnet assembly to melt said low temperature melting metal tape; and
   (g) cooling said magnet assembly to solidify said metal tape, thereby securing said multicore superconductor to said hollow conductor carrier.

2. A method according to claim 1, wherein said low temperature melting metal is selected from the group consisting of an Sn-Ag alloy, Sn, an Sn-Pb alloy, In and an In alloy.

3. A method according to claim 2, further comprising the step of preforming said multicore superconductor so as to fit in said groove of said carrier.

4. A method according to claim 3, wherein said preforming step comprises braiding a plurality of composite conductor elements to form a braided conductor element assembly, working said braided conductor element assembly to fit in said groove, and thereafter subjecting said worked conductor element assembly to a diffusion heat treatment, whereby said multicore superconductor is formed.

5. A method according to claim 3 wherein the construction of said multicore superconductor comprises:
   (a) inserting a plurality of Nb cores into a Cu-Sn matrix, containing less than 10% Sn by weight, to form a composite conductor element;
   (b) reducing the diameter of said element to a predetermined value;
   (c) electrodepositing a layer of tin on the surface of said reduced diameter element; and
   (f) diffusion heat treating said tin electroplated element.

6. A method according to claim 3 wherein the construction of said multicore superconductor comprises:
   (a) inserting a plurality of Nb cores into a Cu-Sn matrix, containing 2-15% Sn by weight, to form a composite conductor element;
   (b) sheathing the surface of said element with a copper layer to form a copper-sheathed element assembly;
   (c) reducing the diameter of said assembly to a predetermined value;
   (d) electrodepositing a layer of tin on the surface of said reduced diameter sheathed assembly; and (e) diffusion heat treating said tin-electroplated assembly.

7. A method according to claim 2 wherein the construction of said multicore superconductor comprises:
   (a) providing a first hollow pipe composed of an alloy of copper and one constituent of an intermetallic compound selected from the group consisting of $Nb_3Sn$, $V_3Ga$, $Nb_3Ge$, $Nb_3Ga$, $Nb_3Si$, $Nb_3Al$ and $Nb_3(Al_{0.8}Ge_{0.2})$;
   (b) inserting into said pipe a plurality of cores composed of the other constituent of said intermetallic compound to form a composite conductor element;
   (c) reducing the diameter of said element to a predetermined value;
   (d) assembling a plurality of said reduced diameter elements to form a bundle;
   (e) inserting said bundle into a second hollow pipe of the same composition as said first hollow pipe to form an assembly;
   (f) reducing the diameter of said assembly to a predetermined value;
   (g) working said reduced diameter assembly to fit into the groove of said carrier; and
   (h) diffusion heat treating said worked assembly.

8. A method according to claim 2 wherein the construction of said multicore superconductor comprises:
   (a) providing a first hollow copper pipe;
   (b) inserting into said pipe a plurality of cores composed of one constituent of an intermetallic compound selected from the group consisting of $Nb_3Sn$, $V_3Ga$, $Nb_3Ge$, $Nb_3Ga$, $Nb_3Si$, $Nb_3Al$ and $Nb_3(Al_{0.8}Ge_{0.2})$, to form a composite conductor element;
   (c) reducing the diameter of said element to a predetermined value;
   (d) assembling a plurality of said reduced diameter elements to form a bundle;
   (e) inserting said bundle into a second hollow copper pipe to form an assembly;
   (f) reducing the diameter of said assembly to a predetermined value;
   (g) electrodepositing on said reduced diameter assembly a layer of the other constituent of said intermetallic compound;
   (h) working said electroplated assembly to fit into the groove of said carrier; and
   (i) diffusion heat treating said assembly.

9. A method as set forth in claim 1, wherein said hollow conductor carrier is constructed of copper and has a substantially rectangular cross-section.

10. A method as set forth in claim 2, wherein said metal tape is heated and molten in a non-oxidizing atmosphere at a temperature higher than the melting point of said metal.

11. A method as set forth in claim 2, wherein said metal tape is heated and molten under vacuum.

* * * * *